(12) United States Patent
Sarma et al.

(10) Patent No.: US 7,527,994 B2
(45) Date of Patent: May 5, 2009

(54) AMORPHOUS SILICON THIN-FILM TRANSISTORS AND METHODS OF MAKING THE SAME

(75) Inventors: Kalluri R. Sarma, Mesa, AZ (US); Charles S. Chanley, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 106 days.

(21) Appl. No.: 10/932,478

(22) Filed: Sep. 1, 2004

(65) Prior Publication Data

US 2006/0046335 A1    Mar. 2, 2006

(51) Int. Cl.
H01L 21/20 (2006.01)

(52) U.S. Cl. .......... 438/30; 438/158; 438/159; 438/162; 438/482; 438/484; 257/E21.158; 257/E21.414; 257/E21.433; 257/E21.602; 257/E21.646; 257/E27.026; 257/E27.061; 257/E27.081; 257/E27.102; 257/E29.004; 257/E29.012; 257/E29.265; 257/E29.268

(58) Field of Classification Search .......... 438/30, 438/158–162, 482, 484; 257/E21.158, 414, 257/433, 602, 646, E27.026, 61, 85, 102, 257/E29.004, 12, 265, 268
See application file for complete search history.

(56) References Cited

U.S. PATENT DOCUMENTS

| | | | |
|---|---|---|---|
| 4,085,498 A * | 4/1978 | Rideout | 438/241 |
| 4,587,720 A * | 5/1986 | Chenevas-Paule et al. | 438/160 |
| 4,667,217 A * | 5/1987 | Janning | 365/184 |
| 4,685,195 A | 8/1987 | Szydlo et al. | |
| 4,738,937 A | 4/1988 | Parsons | |
| 4,843,443 A | 6/1989 | Ovshinsky et al. | |
| 5,017,983 A * | 5/1991 | Wu | 257/61 |
| 5,313,082 A * | 5/1994 | Eklund | 257/262 |
| 5,610,737 A | 3/1997 | Akiyama et al. | |
| 5,661,050 A * | 8/1997 | den Boer et al. | 438/30 |
| 5,712,494 A | 1/1998 | Akiyama et al. | |
| 5,827,760 A | 10/1998 | Seo | |
| 5,838,037 A | 11/1998 | Masutani et al. | |
| 5,994,157 A * | 11/1999 | Aggas et al. | 438/30 |
| 6,156,583 A * | 12/2000 | Hwang | 438/30 |
| 6,197,625 B1 * | 3/2001 | Choi | 438/158 |
| 6,225,149 B1 | 5/2001 | Gan et al. | |
| 6,479,398 B1 | 11/2002 | Chen et al. | |
| 6,504,182 B2 | 1/2003 | Green et al. | |
| 6,521,511 B1 | 2/2003 | Inoue et al. | |
| 6,534,350 B2 | 3/2003 | Chen et al. | |
| 6,558,987 B2 | 5/2003 | Lee | |
| 6,586,768 B1 | 7/2003 | Huang et al. | |
| 6,620,719 B1 | 9/2003 | Andry et al. | |
| 6,717,638 B1 | 4/2004 | Kim | |
| 2003/0027412 A1 | 2/2003 | Chen et al. | |
| 2003/0122975 A1 | 7/2003 | Kim et al. | |
| 2003/0168966 A1 | 9/2003 | Kobayashi et al. | |
| 2004/0086807 A1 | 5/2004 | Peng et al. | |

* cited by examiner

*Primary Examiner*—Michael S Lebentritt
(74) *Attorney, Agent, or Firm*—Ingrassia Fisher & Lorenz, P.C.

(57) ABSTRACT

The present invention provides amorphous silicon thin-film transistors and methods of making such transistors for use with active matrix displays. In particular, one aspect of the present invention provides transistors having a structure based on a channel passivated structure wherein the amorphous silicon layer thickness and the channel length can be optimized. In another aspect of the present invention thin-film transistor structures that include a contact enhancement layer that can provide a low threshold voltage are provided.

13 Claims, 8 Drawing Sheets

AMORPHOUS SILICON THIN-FILM TRANSISTORS AND METHODS OF MAKING THE SAME

TECHNICAL FIELD

The present invention relates generally to active matrix liquid crystal displays and method of making such displays. More particularly, the present invention relates to amorphous silicon thin-film transistors for use in active matrix liquid crystal displays.

BACKGROUND

Liquid crystal displays are frequently used to provide displays for mobile phones and other handheld electronic devices, laptop and desktop computers, video cameras, large screen televisions, as well as demanding applications such as avionic cockpit displays. A liquid crystal display can provide a small, rugged, lightweight, and power-efficient device that can realize a high image quality. Moreover, one type of liquid crystal display, the active matrix liquid crystal display, can provide a display with a high reaction speed and minimal residual images making it well suited for digital televisions.

In a liquid crystal active matrix display, light emitting display pixels are driven independently by selectively activating thin-film transistors associated with each display pixel. A schematic view of a conventional active matrix liquid crystal display structure 10 is shown in FIG. 1. The display structure 10 includes gate bus lines 12 and data bus lines 14 that are connected to a gate driver circuit 16 and a data driver circuit 18, respectively. Thin-film transistors 20 are formed at the intersection of each of the gate bus lines 12 and data bus lines 14 and are each operatively associated with a particular display pixel. In this structure, gate electrodes of the thin-film transistors 20 are connected to the gate bus lines 12, source electrodes are connected to the data bus lines 14, and drains are connected to pixel electrodes 22. Each pixel electrode is associated with a particular light emitting display pixel of the matrix. When a voltage is applied to the gate electrode of a thin-film transistor 20 through an associated gate bus line 12, thin-film transistor 20 is turned on to provide pixel electrode 22 with the input signal voltage from data driver circuit 18 through the data bus lines 14. As a result, the configuration of the liquid crystal changes to regulate the amount of light being emitted by the display pixel.

Thin-film transistors for active matrix liquid crystal displays typically include a semiconductor material, usually polycrystalline silicon or amorphous silicon. Transistors that are made from amorphous silicon are usually formed with a back channel etched structure or a channel passivated structure. A cross sectional view of a conventional back channel etched thin-film transistor 24 is shown in FIG. 2. Generally, the transistor 24 comprises a thin-film layered structure and is formed on a glass substrate 26 and includes a gate electrode 28, gate dielectric layer 30, amorphous silicon layer 32, source contact region 34, drain contact region 36, channel region 38, and a passivation layer 40. The source contact region 34 and the drain contact region 36 also typically include contact enhancement layers 42 and 44 respectively, which are discussed in more detail below.

Semiconductor devices, such as thin-film transistors, are typically designed and manufactured according to a predetermined set of design rules. Generally, a particular set of design rules specifies certain device parameters that device designers agree to follow in order to provide a standardized manufacturing process. For example, a typical set of design rules specifies parameters such as the smallest feature size allowed, the smallest feature spacing allowed, and the minimum overlap of features on different layers allowed, as well as many others. One factor used in determining such minimum design rules is defined by the minimum processable feature sizes for patterning technology such as photolithography.

One advantageous feature of a back channel etched structure is that it can provide a transistor with a relatively small channel length. By this method, structures can be created with a channel length that has the minimum feature size allowed in accordance with a predetermined set of design rules. Referring to FIG. 2, the channel length of the transistor 24 is indicated by reference numeral 46 and is at least partially defined by an edge of the contact enhancement layer 42 and the contact enhancement layer 44. A small channel length is desirable because a transistor with sufficient on-current can be formed in a relatively small device area. However, this type of structure can be difficult to fabricate. Generally, the contact material for the source and drain contact regions, 34 and 36, is deposited as a thin-film over a contact enhancement layer formed on a surface of the amorphous silicon layer and subsequently patterned and etched to define the source and drain contact regions, 34 and 36. This etching step requires precise control so that the contact enhancement layer is sufficiently removed to define the channel and so that the etching process does not excessively thin the amorphous silicon layer. Typically, this is done by starting with an amorphous silicon layer that is thicker than needed. However, an amorphous silicon layer that is thicker than actually required can adversely affect the device performance by causing enhanced photosensitivity and lower device on-current. Moreover, because such etching processes are generally more difficult to control than deposition processes, it can be difficult to form devices that meet performance specifications within sufficient tolerances.

Regarding a channel passivated structure, a cross sectional view of a conventional channel passivated thin-film transistor structure 48 is shown in FIG. 3. Like the back channel etched transistor 24, a typical transistor 48 comprises a thin-film layered structure and is formed on a glass substrate 50. The transistor 48 includes a gate electrode 52, gate dielectric layer 54, amorphous silicon layer 56, etch stop layer 58, source contact region 60, drain contact region 62, channel region 64, and a cap layer 66. The source contact region 60 and the drain contact region 62 also usually include contact enhancement layers 68 and 70 respectively, which are discussed in more detail below.

One advantage of this structure is that the thickness of the amorphous silicon layer 56 can be optimized for device performance unlike in the back channel etched structure. That is, in the channel passivated structure, the source and drain contact regions, 68 and 70, are defined by etching a region 72 and the etch stop layer 58 is used to protect the amorphous silicon layer 56 from being undesirably thinned when the region 72 is etched. In other words, the thickness of the amorphous silicon layer 56 is controlled purely by a controlled deposition process and is unchanged by the etching process. However, the minimum channel length for the channel passivated structure is necessarily larger than the channel length that can be obtained in the back channel etched structure. Specifically, the region 72 is the feature that can be designed to have the minimum device geometry dimension 74 as defined by the design rules. In this structure, the length of the etch stop layer 58 needs to be greater than the length of the region 72 in order to allow for photolithography registration tolerances. Accordingly, channel length 76 is defined by the length of the etch stop layer 58 and not as the distance between an edge of the contact enhancement layer 68 and the contact enhancement layer 70. The larger channel length of this type of device can result in a larger transistor size for a particular pixel drive current in a liquid crystal display and can also decrease the pixel aperture ratio and luminance.

Prior art back channel etched structures and the channel passivated structures use contact enhancement layers for the source and drain contact regions. Use of these contact enhancement layers can reduce the threshold voltage of the transistor from over 15 volts, without the contact enhancement layer, to less that 5 volts, with the contact enhancement layer. Moreover, the subthreshold voltage slope can also be increased and together with the reduced threshold voltage provides efficient charging of the liquid crystal display pixels.

Typically, the contact enhancement layers comprise highly doped n-type amorphous silicon formed by plasma enhanced chemical vapor deposition. In this process, silane gas is used to supply the silicon while phosphene is used to provide phosphorous as the n-type dopant. Both of these gases can be difficult to handle. In particular phosphene gas requires complex and expensive gas handling techniques and systems. Moreover, because a typical transistor includes both intrinsic amorphous silicon as well as doped amorphous silicon, separate deposition systems are required for each of these materials in order to protect against introducing the dopant species into the intrinsic amorphous silicon.

SUMMARY

Therefore, one aspect of the present invention provides amorphous silicon thin-film transistors and method of making such transistors wherein the advantageous features of the back channel etched structure and the channel passivated structure can be provided in the same thin-film transistor structure. In particular, the present invention provides transistors having a structure based on a channel passivated structure wherein the channel length can be formed to have a minimum feature size according to a predetermined set of semiconductor manufacturing design rules. Accordingly, both the amorphous silicon layer thickness and the channel length can be optimized in the same device. However, it is noted that the channel length can be based on any desired factors such as the desired performance specifications for a particular transistor. In another aspect of the present invention thin-film transistor structures that comprise a contact enhancement layer that can provide a low threshold voltage without the use of phosphene gas are provided.

More particularly, one aspect of the present invention provides methods of making amorphous silicon thin-film transistors for active matrix liquid crystal displays. As such, in one aspect of the present invention, a method of making a channel passivated amorphous silicon thin-film transistor for an active matrix liquid crystal display is provided. An initial step of this method comprises forming a transistor body on a substrate, such as a glass substrate, for example. The transistor body preferably comprises a thin-film structure comprising a gate dielectric layer sandwiched between a gate electrode and an amorphous silicon layer. A thin-film dielectric layer is preferably formed on the amorphous silicon layer. A source contact region is preferably formed by providing a first opening in the thin-film dielectric layer to expose a first portion of the amorphous silicon layer. A source contact material can then be provided within the first opening in the thin-film dielectric layer to form a source contact with the first portion of the amorphous silicon layer. Also, a drain contact region is preferably formed by providing a second opening in the thin-film dielectric layer to expose a second portion of the amorphous silicon layer. A drain contact material can then be provided within the second opening in the thin-film dielectric layer to form a drain contact with the second portion of the amorphous silicon layer. Preferably, in such a structure, an edge of the source contact material is spaced from an edge of the drain contact material by a predetermined distance that defines a channel length of a channel region of the thin-film transistor.

In another aspect of the present invention, a method of making a channel passivated amorphous silicon thin-film transistor having a predetermined feature size is provided. Such a transistor can be used for an active matrix liquid crystal display in accordance with the present invention. An initial step of this method comprises forming a transistor body on a substrate, such as a glass substrate, for example. The transistor body preferably comprises a thin-film structure comprising a gate dielectric layer sandwiched between a gate electrode and an amorphous silicon layer. Preferably, a passivation layer is formed on the amorphous silicon layer so that a length of the passivation layer is defined by a predetermined feature size. For example, a minimum feature size from a predetermined set of semiconductor processing design rules can be used. Additionally, a source contact region and a drain contact region are preferably formed so that the passivation layer is positioned between the source contact region and the drain contact region so that the length of the passivation layer defines a channel length of the thin-film transistor.

In yet another aspect of the present invention, a method of making an amorphous silicon thin-film transistor that includes a contact enhancement layer for use in an active matrix liquid crystal display is provided. This method generally includes steps of forming a transistor body on a substrate, forming a contact enhancement layer, forming source and drain contact regions, and forming a channel region. Preferably, the transistor body comprises a thin-film structure that includes a gate dielectric layer sandwiched between a gate electrode and a semiconductor layer. In accordance with the present invention, the step of forming a contact enhancement layer preferably includes depositing a ytterbium thin-film on at least a portion of the semiconductor layer. The source contact region and the drain contact region are preferably formed so that at least one of the source contact region and the drain contact region comprises a contact enhancement portion comprising at least a portion of the ytterbium thin-film.

The present invention, in another aspect, also provides amorphous silicon transistor structures. Thus, in another aspect of the present invention, a channel passivated amorphous silicon thin-film transistor for an active matrix liquid crystal display is provided. This thin-film transistor preferably includes a body formed on a substrate. The transistor body preferably includes a thin-film structure comprising a gate dielectric layer sandwiched between a gate electrode and an amorphous silicon layer. A thin-film dielectric layer is preferably formed on the amorphous silicon layer. The transistor also preferably includes a source contact region comprising a first opening in the thin-film dielectric layer and a source contact material contacting a first portion of the amorphous silicon layer within the first opening in the thin-film dielectric layer. Also, the transistor preferably includes a drain contact region comprising a second opening in the thin-film dielectric layer and a drain contact material contacting a second portion of the amorphous silicon layer within the second opening in the thin-film dielectric layer. In accordance with an aspect of the present invention, an edge of the source contact material is preferably spaced from an edge of the drain contact material by a predetermined distance that defines a channel length of a channel region of the thin-film transistor.

In yet another aspect of the present invention, an amorphous silicon thin-film transistor that includes a contact enhancement layer for use in an active matrix liquid crystal display is provided. This transistor preferably includes a transistor body formed on a substrate. The transistor body preferably comprises a thin-film structure comprising a gate dielectric layer sandwiched between a gate electrode and an amorphous silicon layer. Preferably, this transistor also includes a source contact region and a drain contact region wherein at least one of the source contact region and the drain contact region comprises a contact enhancement portion comprising a ytterbium thin-film.

Additionally, another aspect of the present invention provides liquid crystal display devices. Accordingly, in another aspect of the present invention, a liquid crystal display device is provided. Preferably, the liquid crystal display device comprises at least one pixel area. A pixel area preferably includes a pixel electrode addressed by a gate line and a data line. A thin-film transistor is preferably formed in the pixel area. The thin-film transistor preferably includes a gate electrode connected to the gate line for receiving a gate signal from the gate line. A gate dielectric layer is preferably formed on the gate electrode. An amorphous silicon layer is preferably formed on the gate dielectric layer and can be activated by the gate signal. A source contact is preferably formed on the amorphous silicon layer and the source contact can be connected to the data line for receiving a data signal from the data line. A drain contact is preferably formed on the amorphous silicon layer and the drain contact can be connected to the pixel electrode. Preferably, in accordance with an aspect of the present invention at least one of the source contact and the drain contact comprises a thin-film ytterbium contact enhancement layer.

In yet another aspect of the present invention, a liquid crystal display device is provided. Preferably, the liquid crystal display device comprises at least one pixel area. A pixel area preferably includes a pixel electrode addressed by a gate line and a data line. A thin-film transistor is preferably formed in the pixel area. The thin-film transistor preferably includes a gate electrode connected to the gate line for receiving a gate signal from the gate line. A gate dielectric layer is preferably formed on the gate electrode. An amorphous silicon layer is preferably formed on the gate dielectric layer and can be activated by the gate signal. A thin-film dielectric layer is preferably formed on the amorphous silicon layer. The transistor also preferably includes a source contact region comprising a first opening in the thin-film dielectric layer and a source contact material contacting a first portion of the amorphous silicon layer within the first opening in the thin-film dielectric layer. Also, the transistor preferably includes a drain contact region comprising a second opening in the thin-film dielectric layer and a drain contact material contacting a second portion of the amorphous silicon layer within the second opening in the thin-film dielectric layer. In accordance with an aspect of the present invention, an edge of the source contact material is preferably spaced from an edge of the drain contact material by a predetermined distance that defines a channel length of a channel region of the thin-film transistor.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
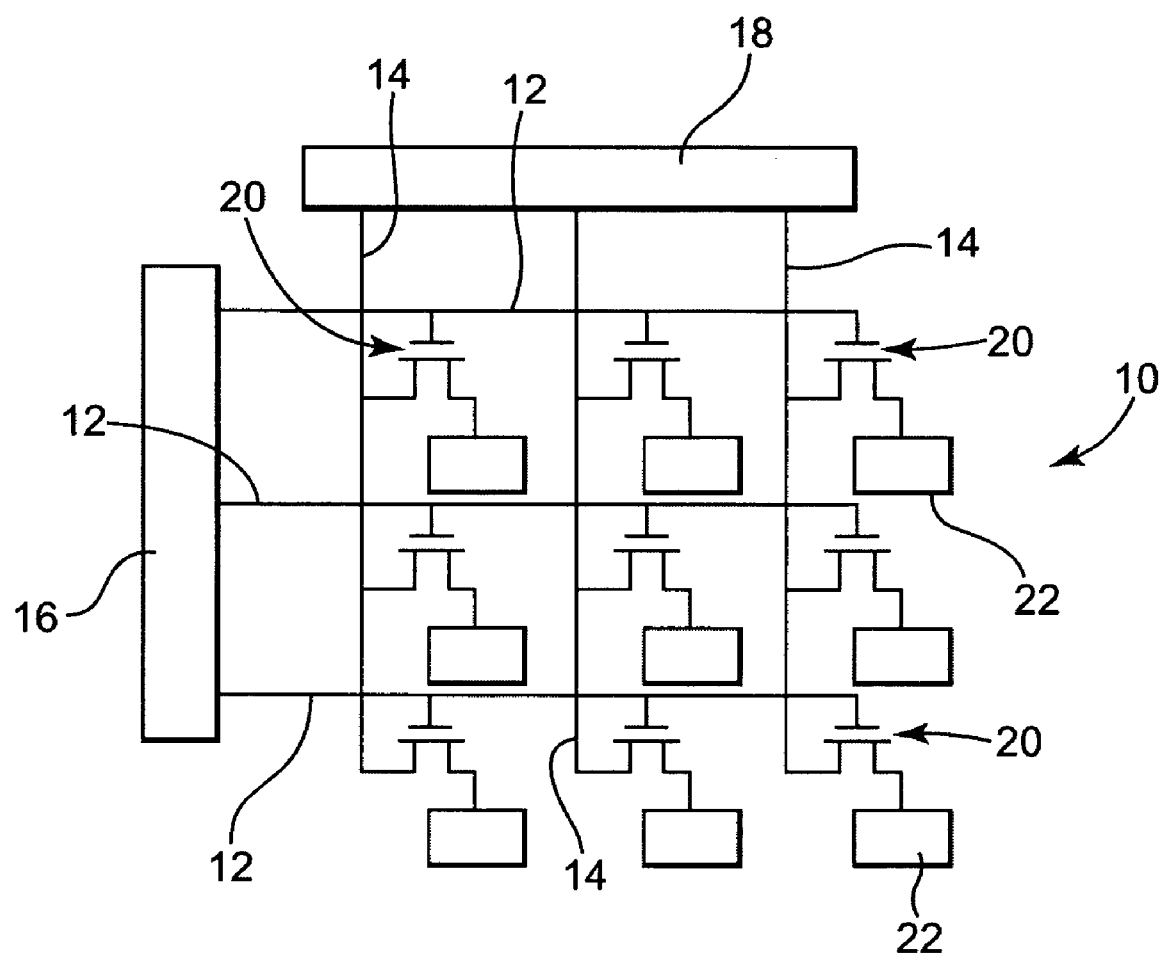
FIG. 1 is a schematic diagram of an active matrix liquid crystal display showing a plurality of gate and data bus lines and a thin-film transistor connected to a pixel electrode at the intersection of each gate and data bus line.
Figure 2:
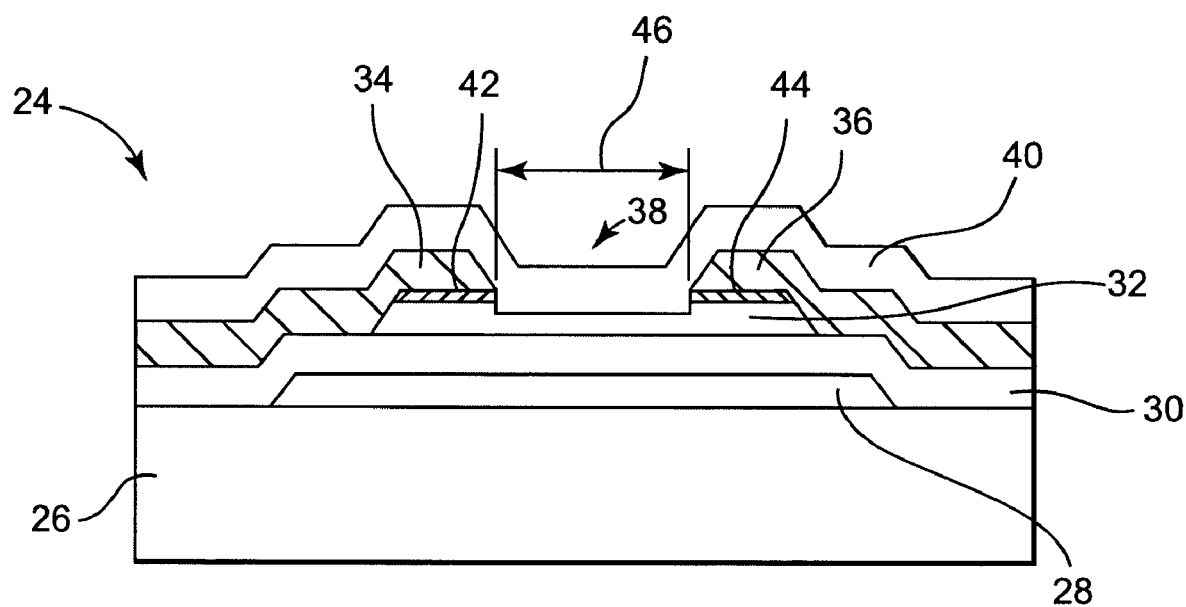
FIG. 2 is a cross-sectional view of a conventional back channel etched amorphous silicon thin-film transistor structure.
Figure 3:
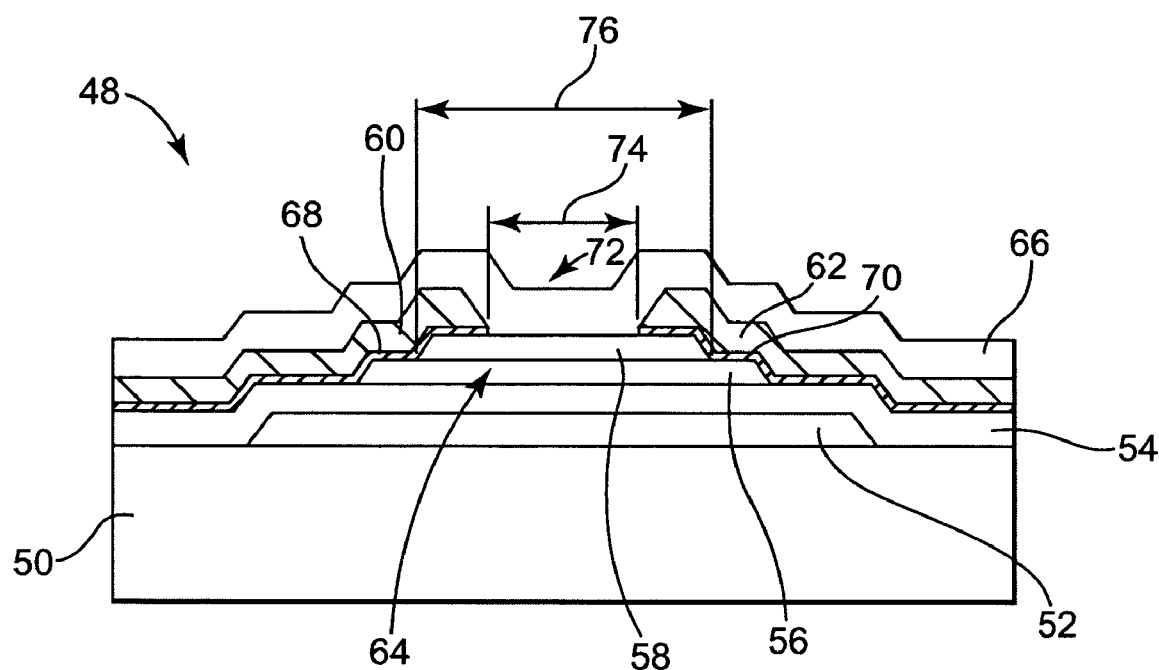
FIG. 3 is a cross-sectional view of a conventional channel passivated amorphous silicon thin-film transistor structure.
Figure 4:
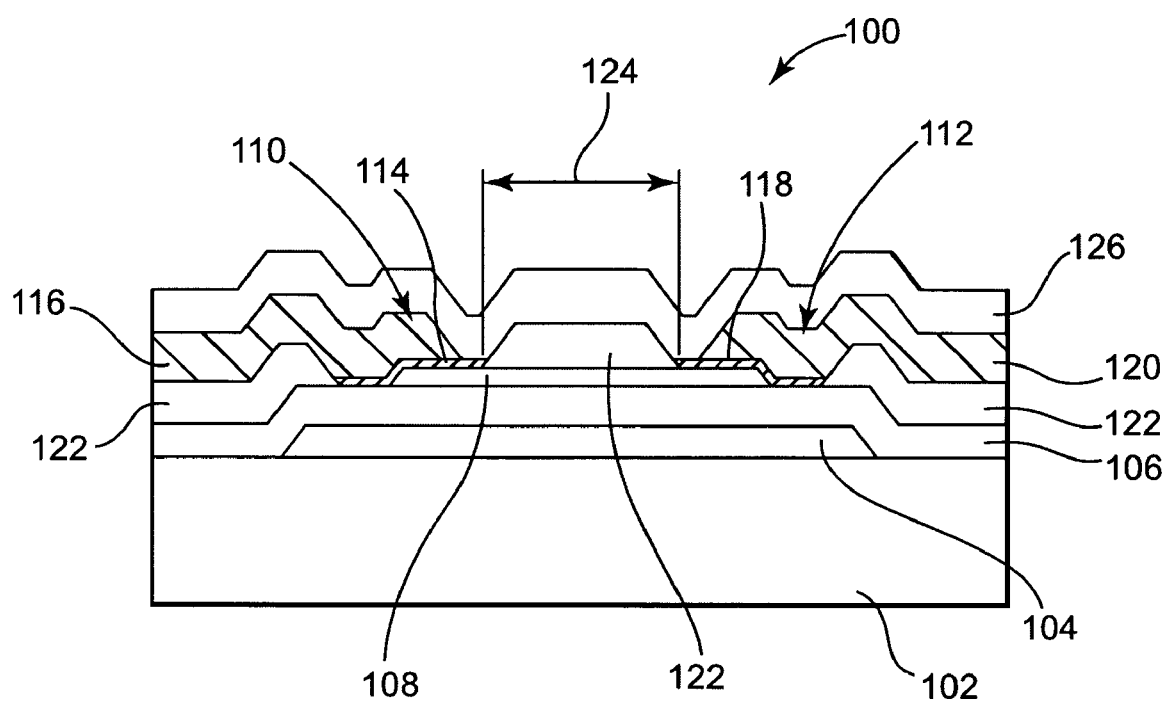
FIG. 4 is a cross-sectional view of an exemplary channel passivated amorphous silicon thin-film transistor structure in accordance with the present invention that can be used in an active matrix liquid crystal display such as illustrated schematically in FIG. 1.

In FIG. 4, one exemplary embodiment of a channel passivated amorphous silicon thin-film transistor 100 in accordance with the present invention is schematically illustrated in cross-section. The transistor 100 can be used as a transistor in an active matrix liquid crystal display such as the transistor 20 of the active matrix liquid crystal display 10 shown in FIG. 1. As described in greater detail in the Background, such a display utilizes an array of thin-film transistors 20 associated with each pixel of the display to control each pixel. However, the transistor 100 may also be used in any other active matrix display devices such as organic light emitting displays and electrophoretic displays, for example. The transistor 100 can also be used in any other electrical circuits and components such as silicon integrated circuits, devices, and the like.

As shown, the transistor 100 is formed on a substrate 102, preferably glass, and comprises a thin-film layered structure. Any suitable substrate material, known or future developed, may be used. Preferably, the transistor 100 includes a gate electrode 104, gate dielectric layer 106, amorphous silicon layer 108, source contact 110, and drain contact 112. The source contact 110 preferably includes a contact enhancement layer 114 and a source electrode 116. Also, the drain contact 112 preferably includes a contact enhancement layer 118 and a drain electrode 120. The transistor 100 also preferably includes a thin-film dielectric layer 122 that is used to define the contact enhancement layers, 114 and 118, and the channel length 124 as described below. Additionally, the transistor 100 preferably includes a cap layer 126, as shown, which can be used for passivation or protection purposes.

As described in more detail below, the transistor 100 is preferably formed so that the channel length 124 has a predetermined feature size. The channel length 124 can be based on factors such as any desired device performance parameters. That is, the transistor 100 can be made according to any desired performance specifications. In one aspect of the present invention, the minimum feature size for a predetermined set of semiconductor manufacturing design rules can be used to define the channel length 124.

Advantageously, methods in accordance with the present invention can be used to define the channel length 124 without the need to etch the amorphous silicon layer 108 as done by prior art back channel methods. That is, the amorphous silicon layer 108 can be formed at a desired thickness (however provided) for optimized device performance and does not need to be thicker in order to accommodate subsequent etching of the amorphous silicon layer 108 when defining the channel length. Such etching can be difficult to control and can make it difficult to provide an amorphous silicon layer with an optimized thickness. Thus, in accordance with the present invention, it is possible to optimize the thickness of the amorphous silicon layer 108 without compromise. Moreover, the channel length 124 can be defined to have a predetermined dimension, such as a minimum feature size according to a predetermined set of semiconductor manufacturing design rules, as described in more detail below.

Thin-film transistors in accordance with the present invention, such as the thin-film transistor 100 shown in FIG. 4, can be made as described below. Preferably, conventional complementary metal oxide semiconductor (CMOS) processing techniques are used, however, any suitable thin-film processing techniques can be used. With reference to FIGS. 5-9, one exemplary method for making the thin-film transistor 100 is illustrated and described below. While an exemplary process is described with respect to the transistor 100, it is noted that a plurality of transistors, similar to the transistor 100, may be formed together on the same substrate for making an active matrix display in accordance with the present invention such as the active matrix liquid crystal display 10 shown in FIG. 1. That is, the transistor 100 may be used as the transistor 20.

Figure 5:
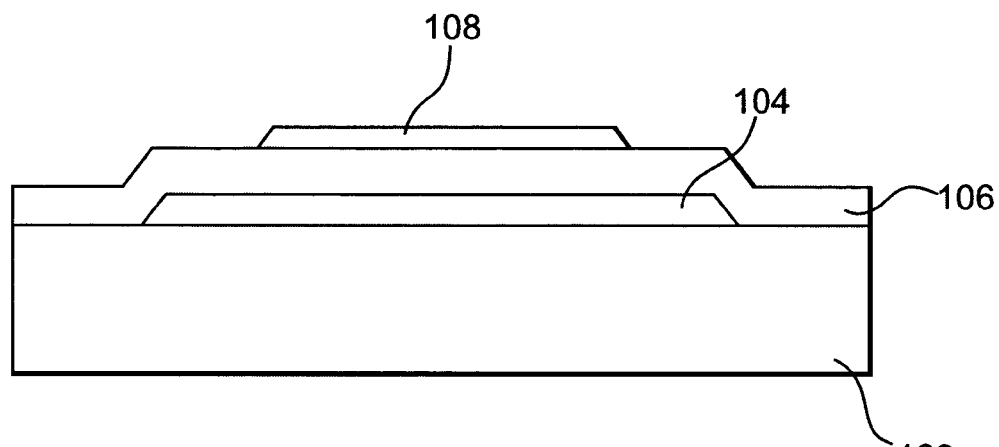
FIG. 5 is a cross-sectional view of the thin-film transistor of FIG. 4 shown in a partially formed state and showing a thin-film structure comprising a gate electrode, a gate dielectric, and an amorphous silicon layer.

Referring to FIG. 5, the gate electrode 104, gate dielectric layer 106, and amorphous silicon layer 108 are shown formed on the substrate 102. Preferably, the substrate 102 comprises a glass suitable for making an active matrix liquid crystal display but any material can be used. For example, the substrate 102 can comprise quartz, sapphire, or ceramic materials. Preferably, the gate electrode 104 is formed by vacuum deposition of a suitable electrode material. Also, the gate electrode 104 preferably comprises a conductor such as a metal or the like. For example, nickel-chrome may be used for the gate electrode 104. The gate electrode 104 is preferably patterned and etched by suitable techniques such as photolithography and wet etching as conventionally known. When the transistor 100 is used in a liquid crystal display, such as the liquid crystal display 10 shown in FIG. 1, the gate electrode 104 may be patterned to include a gate bus line 12 as part of the same patterning process.

After the gate electrode 104 is formed, the gate dielectric layer 106 is preferably deposited on top of the patterned gate electrode 104. Any conventional or developed deposition process can be used and the dielectric layer 106 may comprise any suitable dielectric material such as an oxide or nitride of silicon, for example. The amorphous silicon layer 108 is preferably then deposited on top of the gate dielectric 106 by a suitable deposition process. For example, plasma enhanced chemical vapor deposition may be used. The gate dielectric layer 106 and the amorphous silicon layer 108 may be deposited independently from each other by two separate processes or sequentially as part of a single deposition process as conventionally known. Also, depending on the particular design of the transistor 100, the gate dielectric layer 106 and/or the amorphous silicon layer 108 may be patterned and etched to define any desired device geometry. As illustrated, the amorphous silicon layer 108 is preferably provided as an amorphous silicon island aligned with the gate electrode 104 such as can be done by conventional patterning and etching. Any amorphous silicon material suitable for the active portion of a thin-film transistor may be used and may be doped in any manner to provide any desired electrical properties. Moreover, it is contemplated that polycrystalline silicon may be used as the active portion of the transistor 100. As such, appropriate processing techniques and substrate materials that can handle increased processing temperatures are preferably used.

Figure 6:
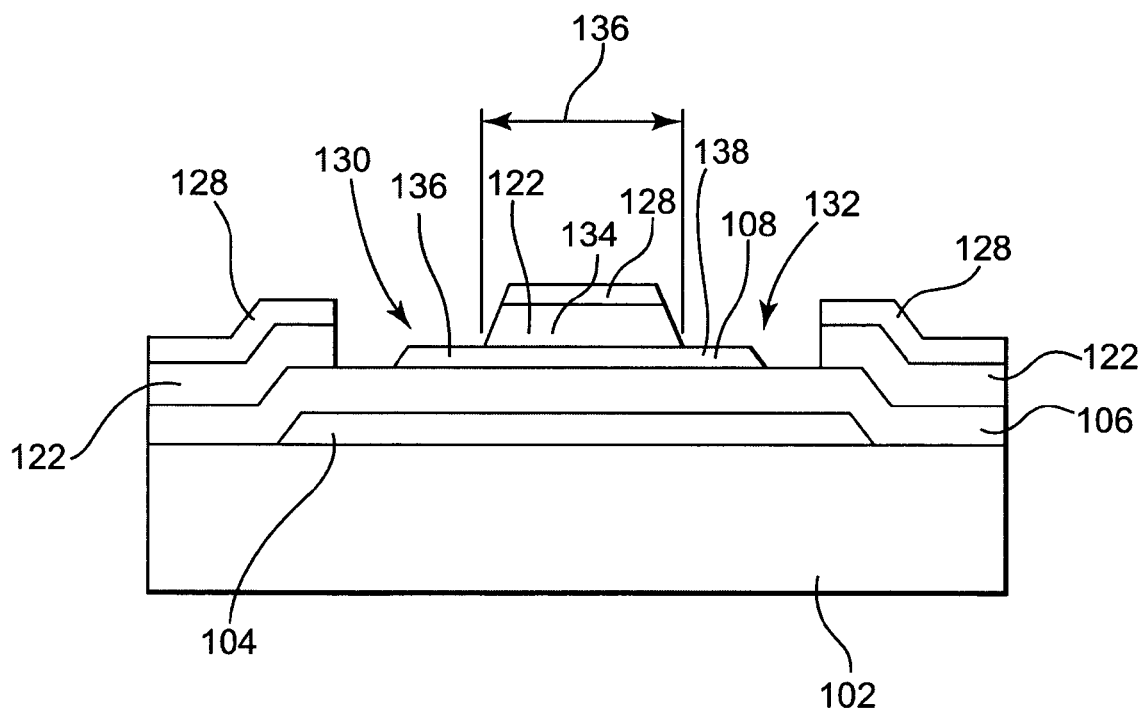
FIG. 6 is a cross-sectional view of the thin-film structure of FIG. 5 with a dielectric thin-film layer formed on the gate dielectric and the amorphous silicon layer and a photoresist layer on the dielectric thin-film layer.

Next, the thin-film dielectric layer 122 is preferably deposited on the gate dielectric 106 and the patterned amorphous silicon layer 108. Preferably, the thin-film dielectric layer 122 is patterned with a photoresist layer 128 and etched to form a source via 130 and a drain via 132 as illustrated in FIG. 6. For example, any conventionally known or future developed photolithography processing techniques can be used along with any desired conventionally known or future developed etching techniques. However, any openings in the thin-film dielectric layer 122 may be used to provide access to the amorphous silicon layer 108 for forming a contact thereto. As such, a portion 134 of the thin-film dielectric layer 122 is provided between the source via 130 and the drain via 132. In accordance with the invention, the length 136 of the portion 134 of the thin-film dielectric layer 122 preferably defines the channel length 124 as described in more detail below. Accordingly, in one aspect of the present invention, the length of the portion 134 of the thin-film dielectric layer 122 can be made with the minimum feature size allowable by a particular set of design rules. However, the portion 134 of the thin-film dielectric layer 122 can have any desired length for forming a thin-film transistor in accordance with the present invention. As illustrated, formation of the source via 130 preferably exposes a portion 137 of the amorphous silicon layer 108 and formation of the drain via 132 preferably exposes a portion 138 of the amorphous silicon layer 108.

In another aspect of the present invention, the contact enhancement layers, 114 and 118, may be provided to improve device performance such as by reducing the threshold voltage and increasing the subthreshold slope, for example. It is noted, however, that the contact enhancement layers, 114 and 118, are not required and any contact structure can be used to provide the source contact 110 and the drain contact 112. For example, an amorphous silicon layer, heavily doped with phosphorus (between $5 \times 10^{17}/cm^3$ and $2 \times 10^{18}/cm^3$) can be used as a contact enhancement layer. Preferably, in accordance with the present invention, at least one of the contact enhancement layers, 114 and 118, comprises ytterbium. More preferably, both of the contact enhancement layers, 114 and 118, comprise ytterbium. For example, as described in more detail below, the contact enhancement layers, 114 and 118, may comprise a deposited ytterbium thin-film layer.

In accordance with the present invention, ytterbium can be used to form a reliable ohmic contact with amorphous silicon.

By using a contact enhancement layer comprising ytterbium, a thin-film transistor having a threshold voltage as low as 2 volts can be provided. Moreover, a contact enhancement layer comprising ytterbium can advantageously function as a hole-blocking layer in an enhancement mode n-channel amorphous silicon thin-film transistor. That is, a contact enhancement layer comprising ytterbium can function to suppress p-channel operation of the thin-film transistor and thereby reduce device off current, which can provide low leakage current levels. It is also contemplated that a contact enhancement layer may comprise any metal(s) that function in a similar manner. That is, metals that have low work function and that can provide a reliable Ohmic contact may be used. More particularly, any metal layer(s) that can function to provide any suppression of p-channel operation by blocking the flow of holes within such a contact may be used as a contact enhancement layer in accordance with the present invention.

Figure 7:
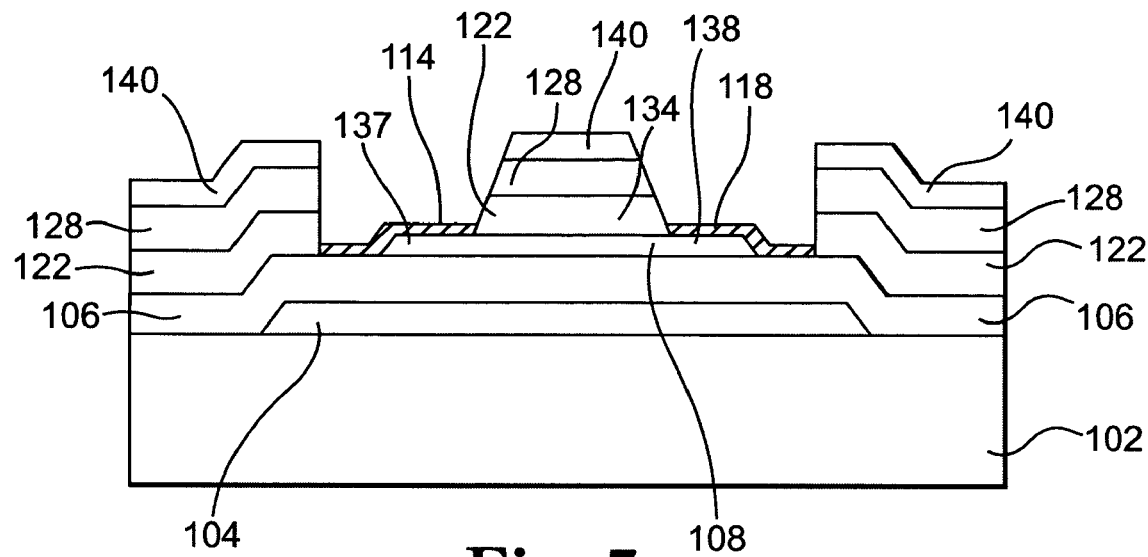
FIG. 7 is a cross-sectional view of the thin-film structure of FIG. 6 with a contact enhancement layer formed on the gate dielectric, the amorphous silicon layer, and the photoresist layer.

With reference to FIG. 7, a thin-film layer 140 is preferably provided for forming the contact enhancement layers, 114 and 118. Preferably, as describe above, the contact enhancement layers, 114 and 118, comprise ytterbium but may comprise any desired material for forming a contact enhancement layer. Accordingly, as one example, ytterbium may be deposited by vacuum deposition, such as thermal evaporation or electron-beam evaporation, in order to provide the thin-film layer 140. Preferably, the thin-film layer 140 is deposited in the source via 130 so that the thin-film layer 140 at least partially covers the portion 136 of the amorphous silicon layer 108. The thin-film layer 140 is also preferably deposited in the drain via 132 so that the thin-film layer 140 at least partially covers the portion 138 of the amorphous silicon layer 108. Additionally, the thin-film layer 140 is preferably deposited on the photoresist layer 128 that has been left on the thin-film dielectric layer 122 after forming the source via 130 and the drain via 132.

Figure 8:
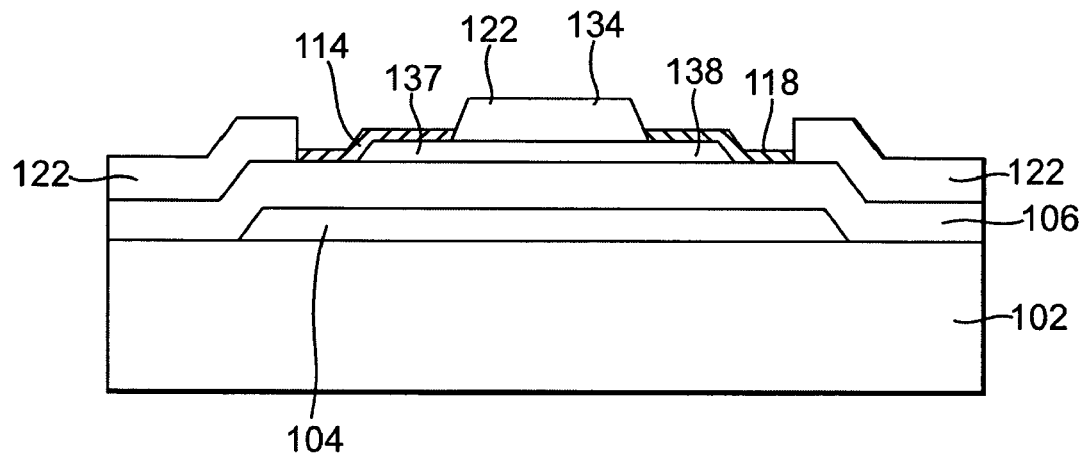
FIG. 8 is a cross-sectional view of the thin-film structure of FIG. 7 with the photoresist layer removed thereby defining a source contact enhancement layer and a drain contact enhancement layer.

Preferably, a lift-off process is used to remove the photoresist layer 128 and the thin-film layer 140 that is deposited on the photoresist layer 128 in order to form the thin-film structure shown in FIG. 8. In a typical lift-off process, a photoresist is first provided on a desired surface to be processed, such as a surface of a thin-film layer. Next, photolithography is used to pattern the photoresist layer. That is, portions of the photoresist material are removed according to a predetermined pattern to expose portions of the underlying layer and so that the remaining photoresist material can function as a mask. The exposed portions of the photoresist layer define areas where a thin-film layer is desired to be formed. Next, a thin-film material is deposited on the photoresist layer and on the exposed portions. The final step of the process is to dissolve the photoresist material thereby lifting off the thin-film material formed on the photoresist layer and leaving the thin-film material on the exposed portions. Such lift-off techniques are well known and any suitable technique can be used. As shown in FIG. 8, by using such a lift-off process, the contact enhancement layer 114 is thus provided in the source via 130 and can provide an electrical contact to the exposed portion 137 of the amorphous silicon layer 108. Also, the contact enhancement layer 118 is provided in the drain via 132 and can provide an electrical contact to the exposed portion 138 of the amorphous silicon layer 108.

Figure 9:
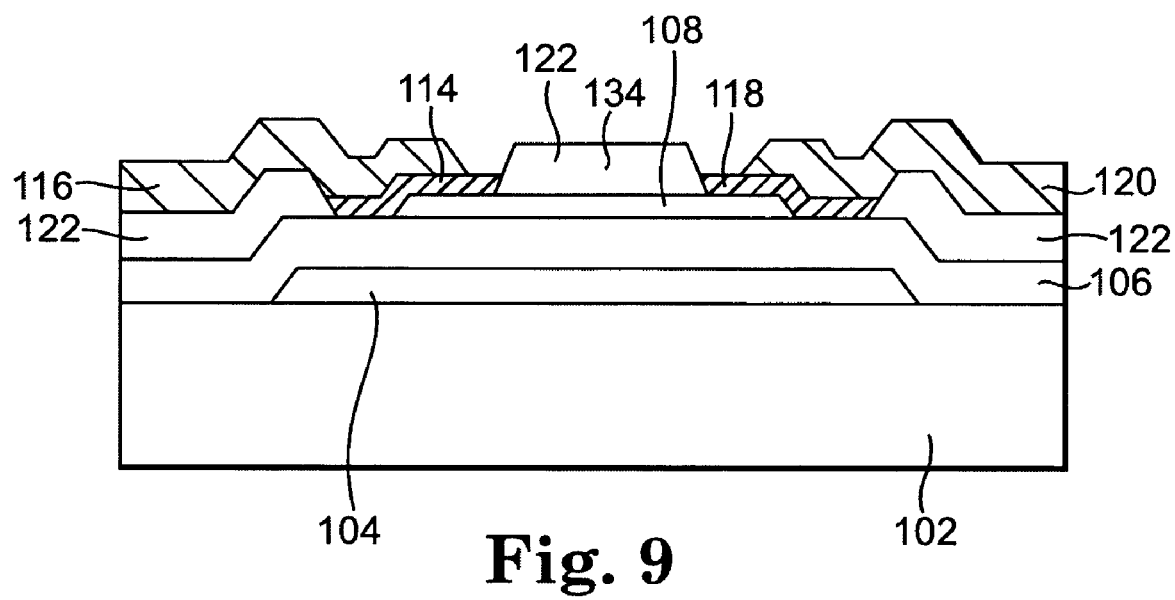
FIG. 9 is a cross-sectional view of the thin-film structure of FIG. 8 with a source contact formed on the source contact enhancement layer and a drain contact formed on the drain contact enhancement layer.

Next, the source electrode 116 and the drain electrode 120 are preferably formed as shown in FIG. 9. This can be done by depositing a thin-film conductor material over the entire structure and then patterning the thin-film by using any known or future developed photolithography and etching techniques. Any desired deposition technique can be used, such as sputtering and any desired conductor can be used. For example nickel-chromium may be used. Preferably, the source and drain electrodes, 116 and 120, are aligned to the contact enhancement layers, 114 and 118, and may also be patterned to connect to or include any desired conducting lines of an active matrix liquid crystal display.

Referring back to FIG. 4, the channel length 124 of the transistor 100 is thus defined by an edge 142 of the contact enhancement layer 114 and an edge 144 of the contact enhancement layer 118. Use of the thin-film dielectric layer 122 facilitates the formation of this structure in that the dielectric layer 122 functions as mask for forming the contact enhancement layers 114 and 118 by preferably using a lift-off technique. It is noted, however, that other conventional or future developed semiconductor processing techniques may be used to form the thin-film structure for the transistor 100, as shown in FIG. 4, and are contemplated by the present invention.

Use of the thin-film dielectric layer 122 in this manner also allows for the channel length 124 to be defined by the length of the portion 134 of the thin-film dielectric layer 122. Advantageously, the portion 134 can be formed with a minimum feature size according to a predetermined set of semiconductor manufacturing rules in accordance with an aspect of the present invention. For example, transistors for use in typical flat panel display devices that have a channel length less than 3 microns can be made in accordance with the present invention. If used for silicon integrated circuit applications, transistors having a channel length less than 0.5 microns can be formed. In any case, a transistor having a channel length defined by a minimum feature size for a predetermined set of design rules can be made.

After the source and drain electrodes, 116 and 120, are formed, the cap layer 126 is preferably deposited over the thin-film structure shown in FIG. 9 to form the transistor 100 shown in FIG. 4. Any desired passivation layer can be used. For example, an oxide or nitride of silicon can be deposited by plasma enhanced chemical vapor deposition. When the transistor 100 is used in a liquid crystal display, such as the liquid crystal display 10 shown in FIG. 1, the source electrode 116 may be pattered to include a data bus line 14 as part of the same patterning process. Also, the drain electrode 120 may be patterned to include a pixel electrode 22, if desired.

Figure 10:
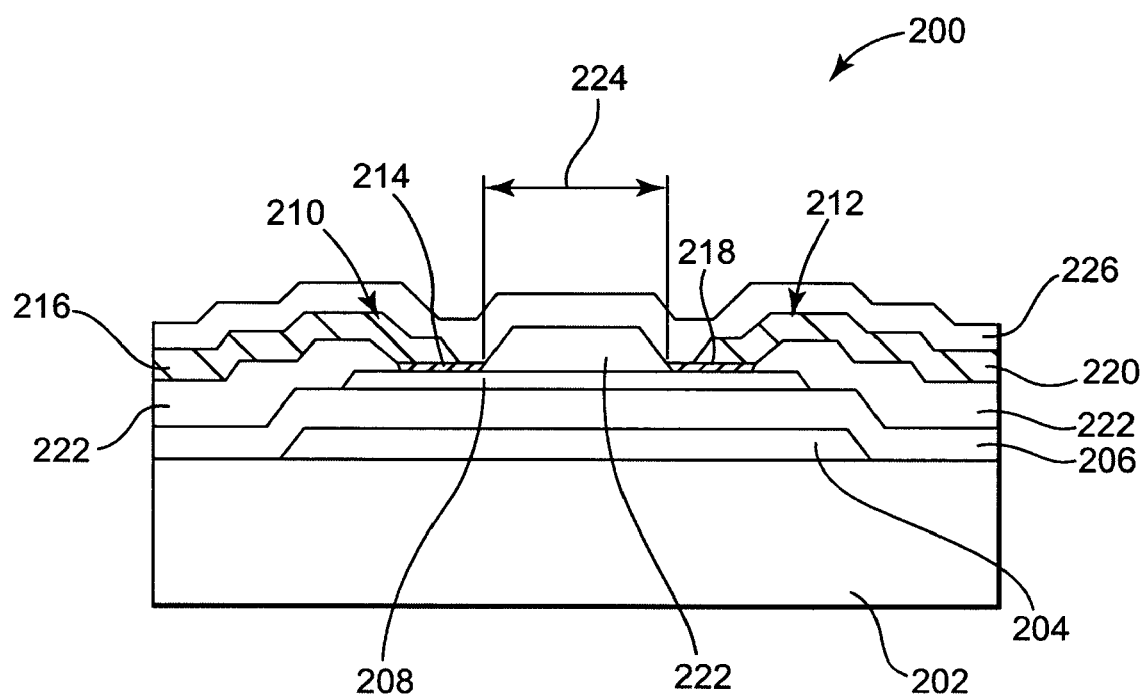
FIG. 10 is a cross-sectional view of another exemplary channel passivated amorphous silicon thin-film transistor structure in accordance with the present invention that can be used in an active matrix liquid crystal display such as illustrated schematically in FIG. 1.

In FIG. 10, another exemplary embodiment of a channel passivated amorphous silicon thin-film transistor 200 in accordance with the present invention is schematically illustrated in cross-section. As described above with respect to the transistor 100, the transistor 200 can be used as a transistor in an active matrix liquid crystal display such as the transistor 20 of the active matrix liquid crystal display 10 shown in FIG. 1, for example.

As shown, the transistor 200 is formed on a substrate 202, preferably glass, and comprises a thin-film layered structure. Preferably, the transistor 200 includes a gate electrode 204, gate dielectric layer 206, amorphous silicon layer 208, source contact 210, and drain contact 212. The source contact 210 preferably includes a contact enhancement layer 214 and a source electrode 216. Also, the drain contact 212 preferably includes a contact enhancement layer 218 and a drain electrode 220. The transistor 200 also preferably includes a thin-film dielectric layer 222 that is used to define the contact enhancement layers, 214 and 218, and the channel length 224 as described above with respect to the transistor 100. The difference between the transistor 200 and the transistor 100, as illustrated, is that the dielectric layer 222 of the transistor 200 extends onto the amorphous silicon 208. Additionally, the transistor 200 preferably includes a cap layer 226, as shown, which can be used for passivation or protection purposes. As described above with respect to the transistor 100, the transistor 200 is preferably formed so that the channel length 224 has a predetermined feature size.

The present invention has now been described with reference to several embodiments thereof. The entire disclosure of any patent or patent application identified herein is hereby incorporated by reference. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

What is claimed is:

1. A method of making a channel passivated amorphous silicon thin-film transistor for an active matrix liquid crystal display, the method comprising the steps of:
    forming a transistor body on a substrate, the transistor body comprising a thin-film structure comprising a gate dielectric layer sandwiched between a gate electrode and an amorphous silicon layer;
    forming a thin-film dielectric layer on the amorphous silicon layer;
    exposing a first portion of the amorphous silicon layer by selectively removing a first portion of the thin-film dielectric layer to provide a source contact region;
    providing source contact material at a first location on the first portion of the amorphous silicon layer to form a source contact with the first portion of the amorphous silicon layer;
    exposing a second portion of the amorphous silicon layer by selectively removing a second portion of the thin-film dielectric layer to provide a drain contact region;
    providing drain contact material at a second location on the second portion of the amorphous silicon layer to form a drain contact with the second portion of the amorphous silicon layer, the drain contact material provided at a predetermined distance from the first location for defining a channel length of a channel region of the amorphous silicon layer wherein the source contact material and the drain contact material comprise a contact enhancement layer deposited on at least a portion of the first exposed portion of the amorphous silicon layer, at least a portion of the second exposed portion of the amorphous silicon layer, and at least a portion of a photoresist layer and the contact enhancement layer comprises a thin-film ytterbium layer;
    lifting off the contact enhancement layer that is deposited on the at least a portion of the photoresist layer by removing the photoresist layer;
    forming a source electrode that is connected to at least a portion of the contact enhancement layer on the at least a portion of the first exposed portion of the amorphous silicon layer; and
    forming a drain electrode that is connected to at least a portion of the contact enhancement layer on the at least a portion of the second exposed portion of the amorphous silicon layer.

2. The method of claim 1, wherein the steps of exposing first and second portions of the amorphous silicon layer comprise providing the photoresist layer on the thin-film dielectric layer, patterning the photoresist layer to form a mask, and etching at least one opening in the thin-film dielectric layer through the mask.

3. The method of claim 1, wherein the contact enhancement layer is deposited by vacuum deposition.

4. The method of claim 3, further comprising the step of forming a cap layer on at least a portion of at least the source electrode, the drain electrode, and the thin-film dielectric layer.

5. The method of claim 1, wherein the vacuum deposition comprises at least one of thermal evaporation and electron-beam evaporation.

6. The method of claim 1, wherein the contact enhancement layer comprises a thin-film doped amorphous silicon layer.

7. The method of claim 1, further comprising the step of determining a channel length of the channel region of the thin-film transistor from a minimum feature size for a predetermined set of semiconductor manufacturing design rules.

8. The method of claim 1, further comprising the steps of forming a pixel electrode, addressing the pixel electrode with a gate line and a data line, connecting the pixel electrode to the drain contact, connecting the gate line to the gate electrode, and connecting the data line to the source contact to form a liquid crystal display device.

9. The method of claim 8, further comprising the step of forming at least one additional transistor having a gate electrode, a source contact, and a drain contact.

10. The method of claim 9, further comprising the steps of forming at least one additional pixel electrode, addressing the at least one additional pixel electrode with a gate line and a data line, connecting the at least one additional pixel electrode to the drain contact of the at least one additional transistor, connecting the gate line to the gate electrode of the at least one additional transistor, and connecting the data line to the source contact of the at least one additional transistor to form a liquid crystal display device.

11. A method of making an amorphous silicon thin-film transistor for an active matrix liquid crystal display, the method comprising the steps of:
    forming a transistor body on a substrate, the transistor body comprising a thin-film structure comprising a gate dielectric layer sandwiched between a gate electrode and an amorphous silicon layer;
    forming a thin-film dielectric layer on the amorphous silicon layer;
    exposing a first portion of the amorphous silicon layer by selectively removing a first portion of the thin-film dielectric layer to provide a source contact region;
    exposing a second portion of the amorphous silicon layer by selectively removing a second portion of the thin-film dielectric layer to provide a drain contact region;
    forming a first portion of a contact enhancement layer on the first portion of the amorphous silicon layer;
    forming a second portion of the contact enhancement layer on the second portion of the amorphous silicon layer, wherein the contact enhancement layer comprises ytterbium;
    forming a source electrode that is connected to the first portion of the contact enhancement layer; and
    forming a drain electrode that is connected to the second portion of the contact enhancement layer.

12. The method of claim 11, wherein the contact enhancement layer is formed by vacuum deposition.

13. The method of claim 12, wherein the vacuum deposition comprises at least one of thermal evaporation and electron-beam evaporation.

* * * * *